(12) United States Patent
Tahara et al.

(10) Patent No.: US 10,681,826 B2
(45) Date of Patent: Jun. 9, 2020

(54) SUBSTRATE UNIT

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Hideaki Tahara, Mie (JP); Kazuyoshi Ohara, Mie (JP); Munsoku O, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/549,407

(22) PCT Filed: Jan. 28, 2016

(86) PCT No.: PCT/JP2016/052409
§ 371 (c)(1),
(2) Date: Aug. 8, 2017

(87) PCT Pub. No.: WO2016/132839
PCT Pub. Date: Aug. 25, 2016

(65) Prior Publication Data
US 2018/0035552 A1    Feb. 1, 2018

(30) Foreign Application Priority Data

Feb. 18, 2015  (JP) ................. 2015-029622

(51) Int. Cl.
*H05K 5/00*  (2006.01)
*H05K 5/02*  (2006.01)
(Continued)

(52) U.S. Cl.
CPC .......... *H05K 5/006* (2013.01); *H05K 5/0213* (2013.01); *H05K 5/0247* (2013.01); *H02G 3/088* (2013.01); *H02G 3/16* (2013.01)

(58) Field of Classification Search
CPC ........................... H05K 5/006; H05K 5/0247
See application file for complete search history.

(56) References Cited

U.S. PATENT DOCUMENTS 7,656,674 B2 * 2/2010 Wetzel ................ F16H 61/0006
361/752
9,204,562 B2 * 12/2015 Shimizu .................. H02G 3/16
(Continued)

FOREIGN PATENT DOCUMENTS

JP    S63-059383    4/1988
JP    2013-176242 A    9/2013
(Continued)

OTHER PUBLICATIONS

Search Report for PCT/JP2016/052409, dated Apr. 19, 2016.

*Primary Examiner* — Daniel P Wicklund
*Assistant Examiner* — Christopher L Augustin
(74) *Attorney, Agent, or Firm* — Honigman LLP (57) ABSTRACT

Provided is a substrate unit that has a simple structure and is able to prevent water that has entered the inside from reaching a mounting surface of the substrate. The substrate unit includes: a substrate, a first casing member that supports the substrate, and a second casing member that is integrated into one piece with the first casing member and is provided on a mounting surface side of the substrate, wherein the second casing member is provided with a protruding portion that protrudes into a housing space that is defined by the first casing member and the second casing member and houses the substrate, and intersects a plane that extends along the mounting surface of the substrate.

2 Claims, 10 Drawing Sheets

(51) Int. Cl.
*H02G 3/16* (2006.01)
*H02G 3/08* (2006.01)

(56) References Cited

U.S. PATENT DOCUMENTS

| | | | | |
|---|---|---|---|---|
| 2004/0004816 | A1* | 1/2004 | Yamaguchi | H05K 3/284 |
| | | | | 361/695 |
| 2004/0159455 | A1* | 8/2004 | Onizuka | H05K 7/026 |
| | | | | 174/50 |
| 2006/0087210 | A1* | 4/2006 | Kim | H05K 5/0213 |
| | | | | 313/24 |
| 2007/0241858 | A1* | 10/2007 | Bessho | H01H 85/2035 |
| | | | | 337/283 |
| 2008/0130224 | A1* | 6/2008 | Hashikura | H05K 7/026 |
| | | | | 361/690 |
| 2008/0223597 | A1* | 9/2008 | Kanou | H02G 3/088 |
| | | | | 174/50 |
| 2008/0266821 | A1* | 10/2008 | Wetzel | H01L 21/50 |
| | | | | 361/757 |
| 2010/0202110 | A1* | 8/2010 | Becker | H05K 1/18 |
| | | | | 361/707 |
| 2012/0200988 | A1* | 8/2012 | Uchida | B60R 16/02 |
| | | | | 361/624 |
| 2013/0032371 | A1* | 2/2013 | Makino | H02G 3/088 |
| | | | | 174/50 |
| 2013/0316550 | A1* | 11/2013 | Makino | B60R 16/02 |
| | | | | 439/76.2 |
| 2014/0345899 | A1* | 11/2014 | Takahashi | G06F 1/1656 |
| | | | | 174/50.51 |
| 2014/0347819 | A1* | 11/2014 | Ott | H05K 5/0082 |
| | | | | 361/714 |
| 2015/0016076 | A1 | 1/2015 | Shimizu et al. | |
| 2015/0173226 | A1* | 6/2015 | Murakami | G06F 1/1601 |
| | | | | 428/192 |
| 2016/0312756 | A1* | 10/2016 | Steinberger | F02P 7/04 |
| 2017/0172006 | A1* | 6/2017 | Kamoshida | H05K 5/0056 |

FOREIGN PATENT DOCUMENTS

| | | |
|---|---|---|
| JP | 2014-156168 A | 8/2014 |
| JP | 2014-0175365 A | 9/2014 |
| WO | WO 2013129132 A1 * 9/2013 | ............ H02G 3/16 |

\* cited by examiner

SUBSTRATE UNIT

CROSS-REFERENCE TO RELATED APPLICATIONS

This application is the U.S. National Phase of PCT/JP2016/052409 filed Jan. 28, 2016, which claims priority of Japanese Patent Application No. 2015-029622 filed Feb. 18, 2015.

FIELD OF THE INVENTION

The present invention relates to a substrate unit that includes a casing and a substrate that is housed in the casing.

BACKGROUND

As disclosed in for example JP 2014-175365A below, an on-board casing or the like that houses electrical devices employs a waterproof structure so that the electrical devices, which are accommodated therein, are prevented from breaking down due to water intrusion.

The approach of sealing the inside of the casing using a sealing member, as disclosed in JP 2014-175365A, increases manufacturing costs.

A problem to be solved by the present invention is to provide a substrate unit that has a simple structure and is able to prevent water that has entered the inside from reaching a mounting surface of the substrate.

SUMMARY OF INVENTION

To solve the above-described problem, a substrate unit according to one aspect of the present invention includes: a substrate; a first casing member that supports the substrate; and a second casing member that is integrated into one piece with the first casing member and is provided on a mounting surface side of the substrate, wherein the second casing member is provided with a protruding portion that protrudes into a housing space that is defined by the first casing member and the second casing member and houses the substrate, and intersects a plane that extends along the mounting surface of the substrate.

The substrate unit further includes: a conductive member that is a plate-like member that is fixed to a surface of the substrate that is opposite the mounting surface, and constitutes a conducting path, wherein a portion of the conductive member passes between the protruding portion and a bottom surface of the first casing member, and is drawn out of the housing space.

It is preferable that a portion of the protruding portion is inserted into a water discharge flow channel that is formed in the first casing member.

In the substrate unit according to the aspect of the present invention, the second casing member is provided with the protruding portion that protrudes into the housing space and intersects a plane that extends along the mounting surface of the substrate. Therefore, it is possible to prevent water that has entered the housing space from flowing toward the substrate (to prevent water from reaching the mounting surface). The protruding portion can be formed in the second casing member that defines the housing space together with the first casing member, and therefore there is no risk of the structure being complex, such as having an increased number of components.

If the conductive member is fixed to the surface of the substrate that is opposite the mounting surface, a portion of the conductive member can be drawn to the outside via the gap between the protruding portion and the bottom surface of the first casing member.

If a structure in which a portion of the protruding portion is inserted into the water discharge flow channel that is formed in the first casing member is employed, water that has entered the housing space is easily discharged from the water discharge flow channel to the outside by being guided by the protruding portion. In other words, the protruding portion achieves not only the function of preventing water from flowing toward the substrate, but also the function of facilitating the discharge of water that has entered the housing space to the outside.

DETAILED DESCRIPTION OF THE PREFERRED EMBODIMENTS

Figure 1:
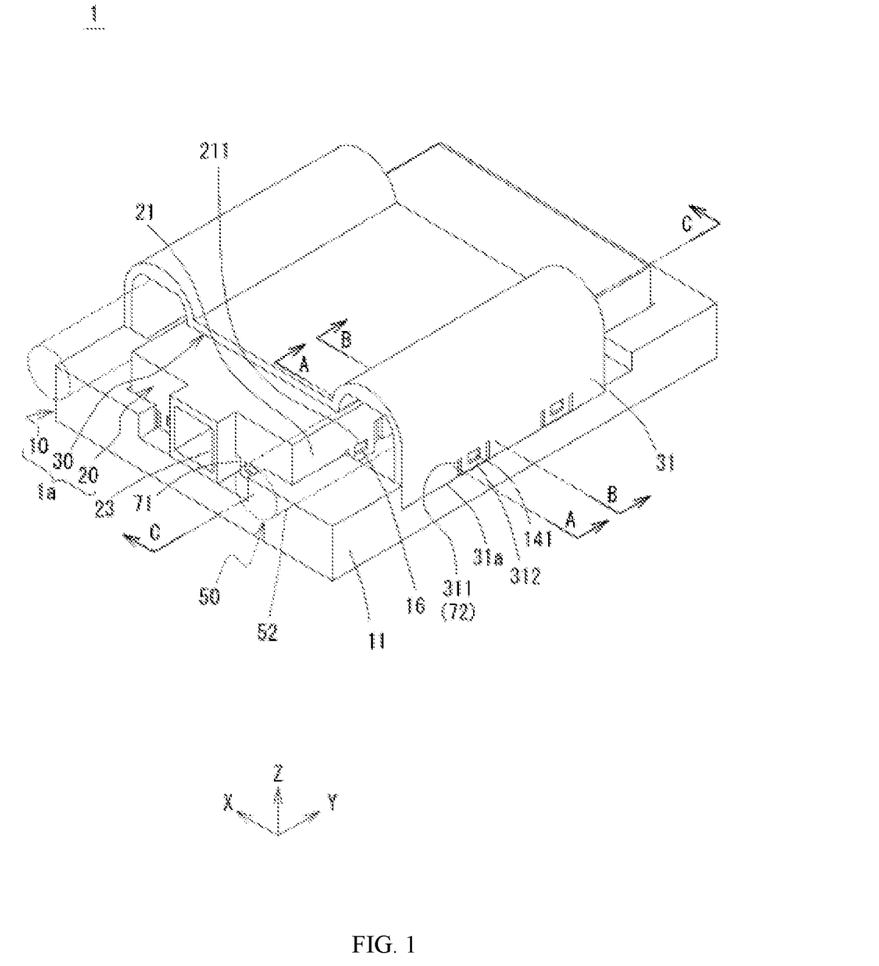
FIG. 1 schematically shows an external view of a substrate unit according to an embodiment of the present invention.

The following describes embodiments of the present invention in detail with reference to the drawings. In the following description, "height direction" (vertical direction) refers to a direction along a Z axis, which is shown in FIG.

1, for example (the direction that is indicated by the arrow is the upward direction), "width direction" refers to a direction along an X axis, "front-rear direction" refers to a direction along a Y axis (the direction that is indicated by the arrow is a rearward direction), and "in-plane direction" refers to a direction along an XY plane, unless otherwise specified. Note that, although these directions do not limit the orientation in which a substrate unit 1 is installed, basically, the substrate unit 1 according to the present embodiment is to be installed such that a first casing member 10 is located on the lower side and a third casing member 30 is located on the upper side.

Figure 2:
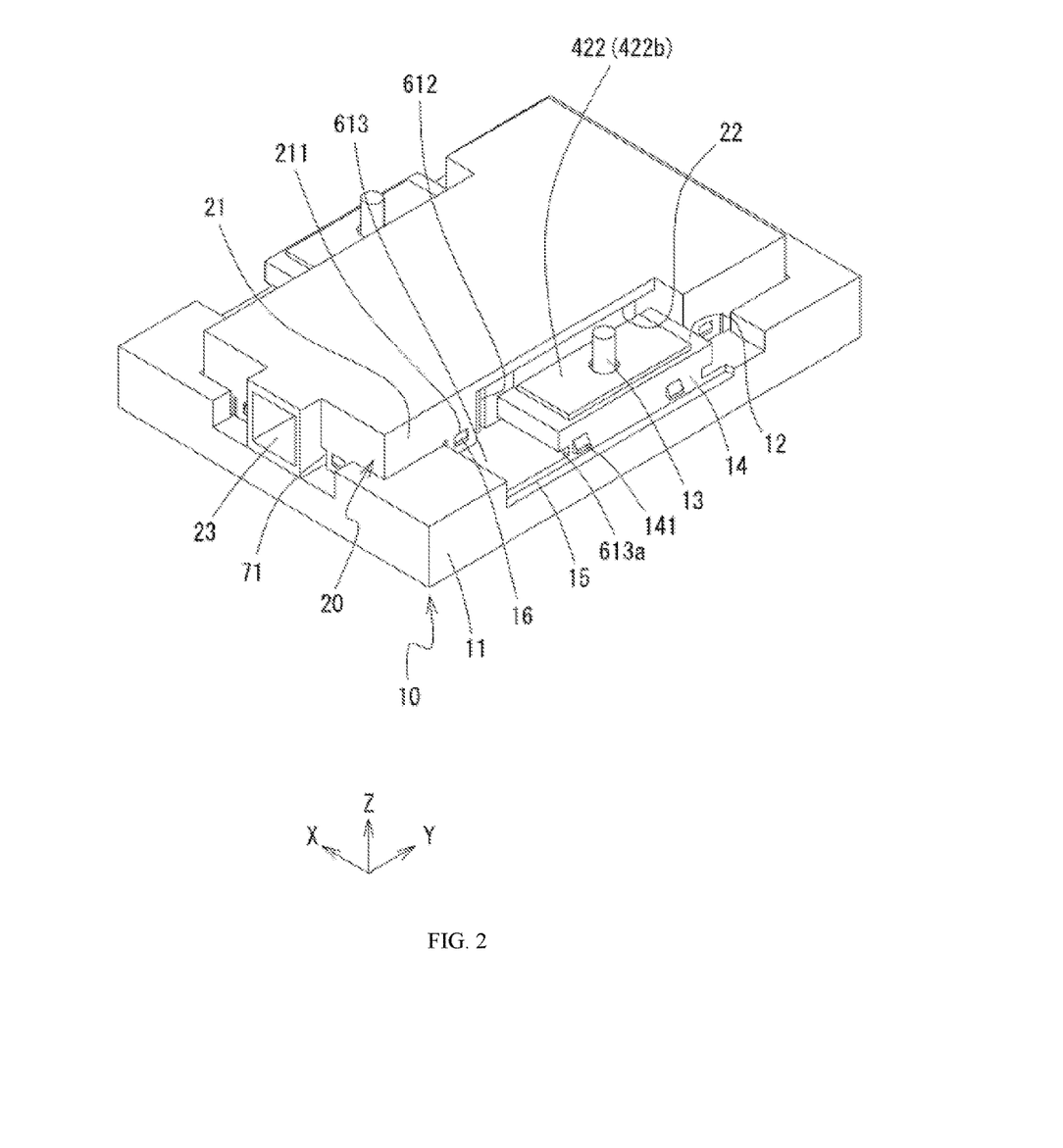
FIG. 2 schematically shows an external view of the substrate unit according to an embodiment of the present invention, from which a second casing member has been removed.

As shown in FIGS. 1 and 2, the substrate unit 1 according to an embodiment of the present invention is an on-board electrical component in which a substrate 41 is housed in a casing 1a. The casing 1a of the substrate unit 1 according to the present embodiment includes a first casing member 10 and a second casing member 20.

A first space S1 (corresponding to a housing space according to the present invention), in which contents are to be housed, is formed in the first casing member 10. The first space S1 formed in the first casing member 10 is covered by the second casing member 20 from above (see FIGS. 3 and 4, for example). In other words, the first space S1 is a space defined by the first casing member 10 and the second casing member 20. The first space S1 according to the present embodiment is a flat space extending in the in-plane direction.

According to the present embodiment, the substrate 41 and a conductive member 42 that is fixed to the substrate 41 (hereinafter also referred to as "set 40 consisting of the substrate and the conductive member"), which are to be accommodated, are housed in the first space S1.

Figure 5:
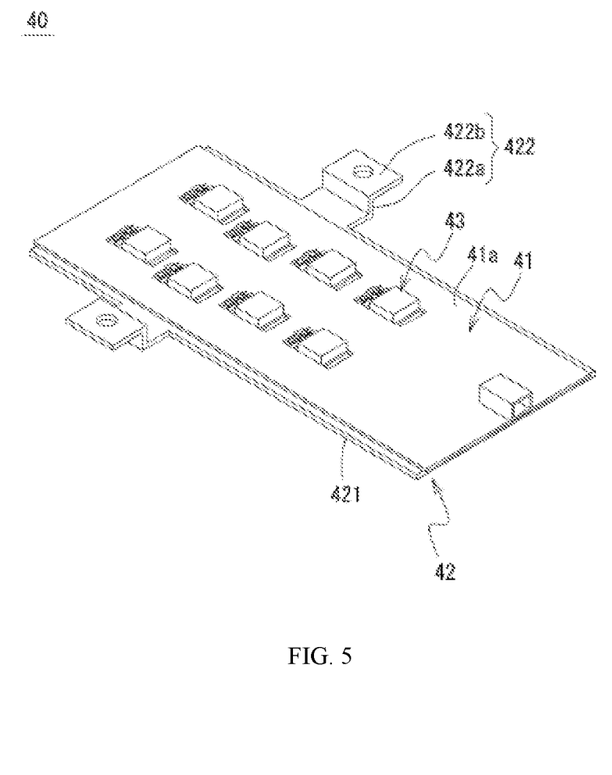
FIG. 5 is an external view of the substrate unit that is to be housed in a casing.
Figure 6:
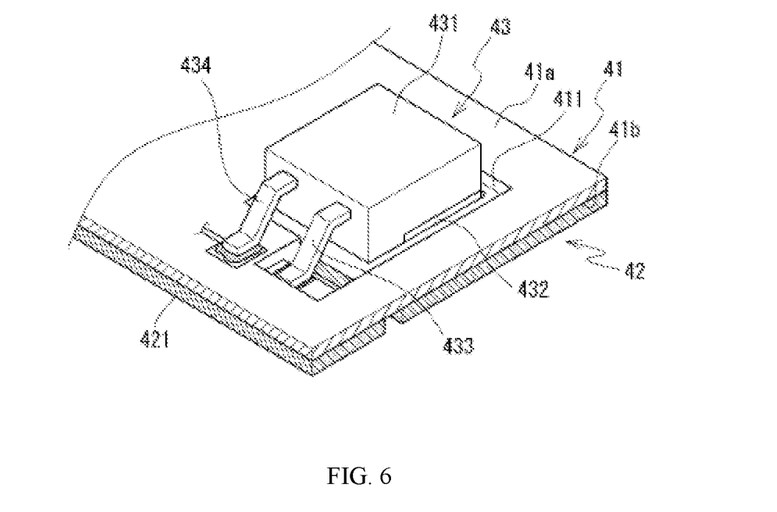
FIG. 6 is an enlarged view of a portion (including a substrate and a conductive member that is fixed to the substrate) of the substrate unit, on which an electronic component (having at least one terminal that is electrically connected to the conductive member) is mounted.
Figure 7:
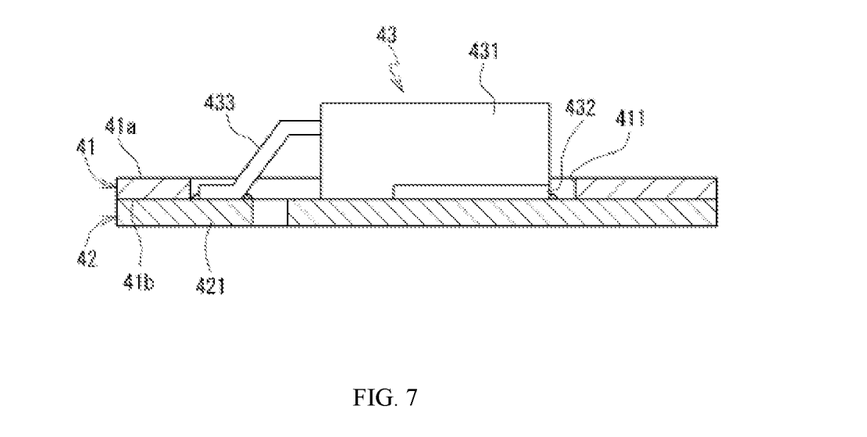
FIG. 7 is a cross-sectional view of the portion (including the substrate and the conductive member that is fixed thereto) of the substrate unit, on which the electronic component (having at least one terminal that is electrically connected to the conductive member) is mounted, and is a cross-sectional view along a plane that passes through a drain terminal and a source terminal.

The set 40 consisting of the substrate and the conductive member shown in FIGS. 5 to 7 includes the substrate 41 and the conductive member 42. A conductive pattern is formed on one surface 41a (the upper surface, corresponding to a mounting surface according to the present invention) of the substrate 41. A conducting path that is constituted by the conductive pattern (a part of the circuitry) is a conducting path for control signals, and a current flowing through this conducting path is relatively smaller than a current flowing through a conducting path (a part of the circuitry) that is constituted by the conductive member 42.

The conductive member 42 includes a main portion 421 that is fixed to another surface 41b (the lower surface) of the substrate 41, and an extension portion 422 that extends from the main portion 421. The conductive member 42 is formed in a predetermined shape through stamping or the like. The main portion 421 of the conductive member 42 constitutes a conducting path for power supply, which is a portion where a current that is relatively large (larger than a current flowing through the conducting path constituted by the conductive pattern) flows. Note that, although specific configurations of conducting paths are not described or illustrated, the main portion 421 of the conductive member 42 includes a plurality of portions that constitute conducting paths. The portions are independent of each other so as not to cause a short, and are integrated into one piece by being fixed to the substrate 41. The plurality of portions are continuous with each other via extra portions before being fixed to the substrate 41. After the plurality of portions have been fixed to the substrate 41, the extra portions are cut away, and thus each portion is brought into an independent state (a state in which each portion is not in direct contact with any other portions). The conductive member 42 (the main portion 421) is also referred to as a bus bar (a bus bar plate), for example. The main portion 421 of the conductive member 42 is fixed to the other surface 41b of the substrate 41, using an insulative adhesive or adhesive sheet, for example. Thus, the substrate 41 and the conductive member 42 are integrated into one piece.

The extension portion 422 of the conductive member 42 is a portion that is formed standing upright on the main portion 421. The extension portion 422 according to the present embodiment includes a portion (a base end portion 422a) that extends upward from the main portion 421, and a portion (a top end portion 422b) that bends from a top end (an upper end) of the base end portion 422a and extends in the in-plane direction. The conductive member 42 according to the present embodiment includes a plurality of extension portions 422. Each extension portion 422 is integrated into one piece with one of the above-described independent portions of the main portion 421. According to the present embodiment, one independent portion and one extension portion 422 are joined to each other. The top end portion 422b of each extension portion 422 serves as a portion (an input terminal portion or an output terminal portion) to which a connection member 50 is connected. The set 40 consisting of the substrate and the conductive member (the conductive member 42) and an external device are to be electrically connected to each other via the connection member 50.

An electronic component 43 includes a device body 431 and a terminal portion. A plurality of electronic components 43 are mounted on the set 40 consisting of the substrate and the conductive member. At least one terminal of a particular electronic component 43 is electrically connected to the main portion 421 of the conductive member 42 via an opening 411 that is formed in the substrate 41. A transistor (an FET) is an example of an electrical component that has at least one terminal that is electrically connected to the main portion 421 of the conductive member 42. A drain terminal 432 and a source terminal 433 of the transistor are connected to the main portion 421 of the conductive member 42, and a gate terminal 434 of the same is connected to the conductive pattern on the substrate 41. In this way, at least one terminal of the electronic component 43 is electrically connected directly to the conductive member 42. From another point of view, it is possible that there is an electronic component 43 all terminals of which are electrically connected directly to the conductive pattern that is formed on the substrate 41 (it is possible that there is an electronic component that has at least one terminal that is not electrically connected directly to the conductive member 42).

The set 40 consisting of the substrate and the conductive member and configured in this way is housed in the first space S1 as described above (see FIGS. 3 and 4, for example). Strictly speaking, a portion of the set 40 consisting of the substrate and the conductive member other than the extension portions 422 is housed in the first space S1. In the present embodiment, the first casing member 10 that defines the first space S1 includes a frame member 11 and a heat dissipation member 19. The frame member 11 has a substantially rectangular shape, and a region inside the frame member 11 is the first space S1. The heat dissipation member 19 is a flat plate-like member that is formed using a material with a high thermal conductivity (such as copper), and is fixed to the lower side of the frame member 11. The heat dissipation member 19 is fixed so as to cover an opening that is located in the lower side of the frame member 11. Due to the presence of the frame member 11 and the heat dissipation member 19, a first space S1 is formed that is flat and extends in the in-plane direction. It can also be said that the frame member 11 is a member that constitutes a side wall of the first space S1, and the heat dissipation member 19 is a member that constitutes a bottom wall of the first space S1. At least a portion of the main portion 421 of the conductive member 42 is joined to the heat dissipation member 19. Therefore, at least a portion of the heat that is generated by the set 40 consisting of the substrate and the conductive member is dissipated to the outside via the heat dissipation member 19. Note that the main portion 421 of the conductive member 42 and the heat dissipation member 19 are preferably joined to each other via an insulative material with a high thermal conductivity. In this way, the set 40 consisting of the substrate and the conductive member is placed on a bottom surface of the first casing member 10 (the heat dissipation member 19), with the conductive member 42 facing downward. In other words, the substrate 41 is (indirectly) supported by the first casing member 10 (with the conductive member 42 therebetween).

Figure 8:
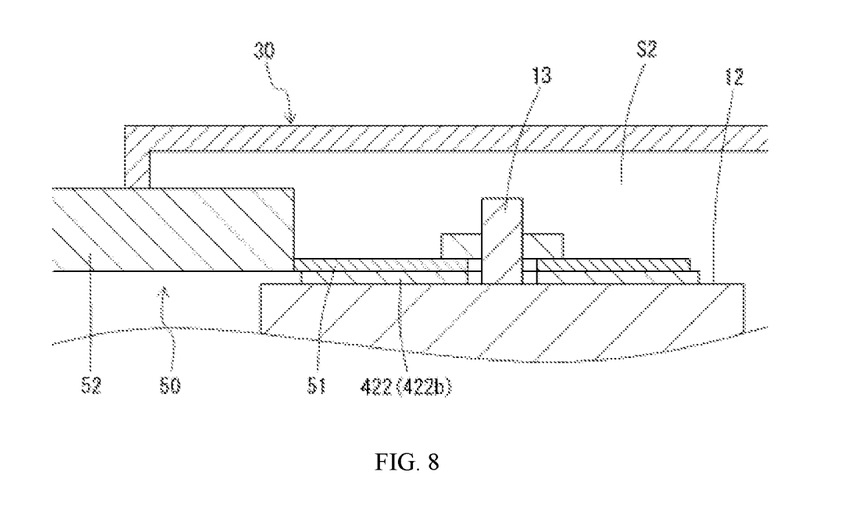
FIG. 8 schematically shows a cross section along a line C-C shown in FIG. 1.

The frame member 11 is provided with a base portion 12 and male screw portions 13 that protrude upward from the base portion 12 (see FIG. 2, for example). Through holes that allow the male screw portions 13 to pass therethrough are formed in the top end portions 422b of the extension portions 422 of the conductive member 42. The male screw portions 13 pass through the through holes that are formed in the top end portions 422b, and the male screw portions 13 also pass through through-holes that are formed in terminals 51 of the connection member 50, and nuts or the like are screwed onto the male screw portions 13. Thus, the top end portions 422b and the terminals 51 are pressed against the base portion 12, and they are brought into intimate contact with each other. Consequently, the conductive member 42 and the connection member 50 are electrically connected to each other (see FIG. 8, for example). The connection member 50 is, for example, one whose terminals 51 are connected to ends of electrical wires 52.

The third casing member 30 is fixed to the first casing member 10 so as to cover the base portion 12. The top end portions 422b of the extension portions 422 and at least a portion of the connection member 50 (the terminals 51) are located on the base portion 12, and therefore both of them are covered by the third casing member 30. From another point of view, the top end portions 422b of the extension portions 422 and at least a portion of the connection member 50 are housed in a second space S2 that is defined by the third casing member 30 and the first casing member 10 (the frame member 11).

According to the present embodiment, a waterproof wall 32 for preventing water that has entered the second space S2 from entering the first space S1 is formed on the first space S1 side of the third casing member 30. As described later in detail, according to the present embodiment, a protruding portion 24 that is formed on the second casing member 20 prevents water that has entered the first space S1 from flowing toward the substrate 41. However, it is also possible to prevent water from entering the first space S1 by constructing the above-described waterproof wall 32.

An opening of the first space S1 that is formed in the first casing member 10 is covered by the second casing member 20. In other words, the second casing member 20 defines the first space S1 together with the first casing member 10, and constitutes the upper wall of the first space S1. The second casing member 20 is fixed to the frame member 11 of the first casing member 10. The second casing member 20 has a shape that covers at least a portion of the upper surface of the frame member 11 excluding the base portion 12. An outer wall of the second casing member 20 has a shape that is as if partially cut out, and due to the presence of such cutouts (cutout portions 22), gaps that allow the extension portions 422 to pass therethrough are secured even when the second casing member 20 is in the state of being fixed to the first casing member 10 (see FIG. 2, for example).

An outer wall portion 21 of the second casing member 20 is provided with a locking hole 211 that is to be locked to a locking protrusion 16 that is provided on the first casing member 10. The locking protrusion 16 and the locking hole 211 engage with each other, and thus the two case members are integrated into one.

In a situation where the second casing member 20 is fixed to the first casing member 10, there are the above-described gaps between the cutout portions of the second casing member 20 and the first casing member 10, and the extension portions 422 pass through the gaps. Consequently, the top end portions 422b of the extension portions 422 are located on the base portion 12. Note that the second casing member 20 according to the present embodiment is provided with a connector portion 23 for electrically connecting the substrate 41 to an external device.

Figure 3:
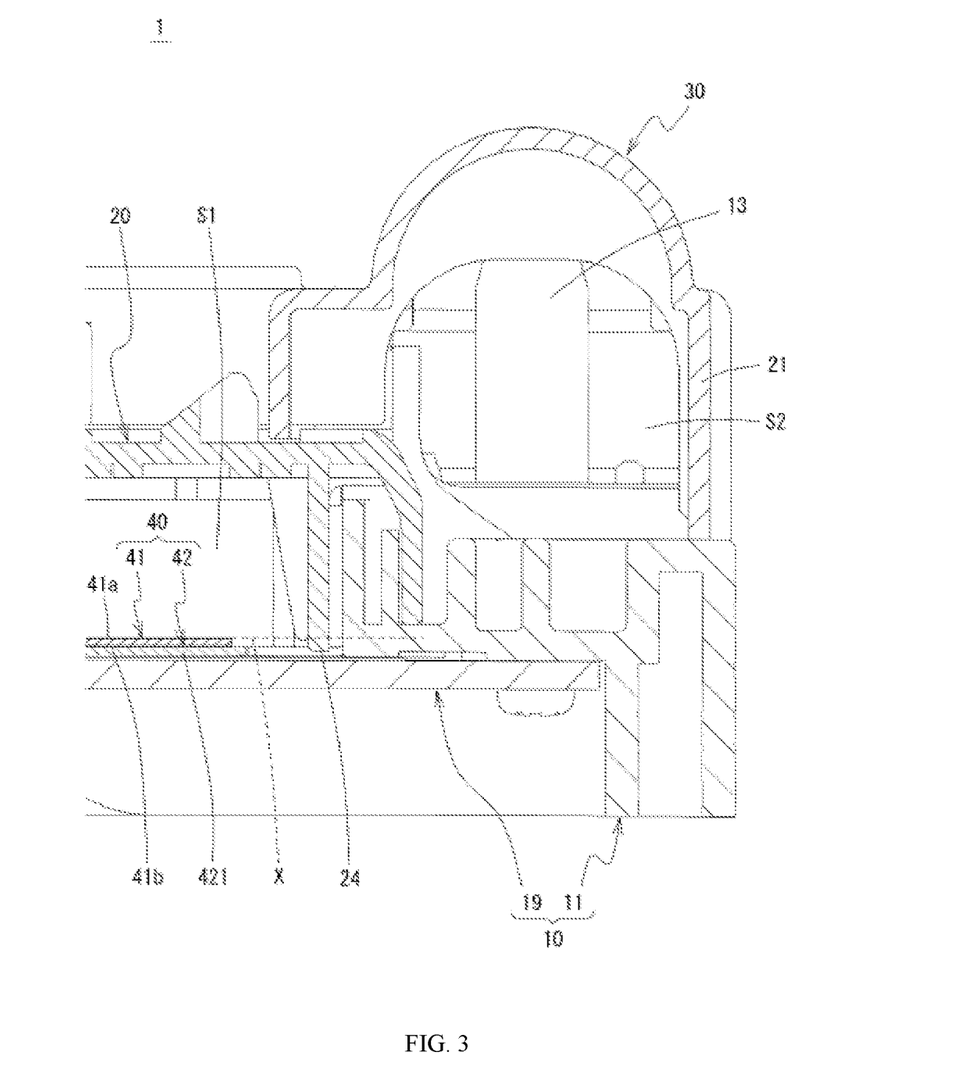
FIG. 3 is a cross-sectional view along an A-A line shown in FIG. 1 (a connection member is omitted).
Figure 4:
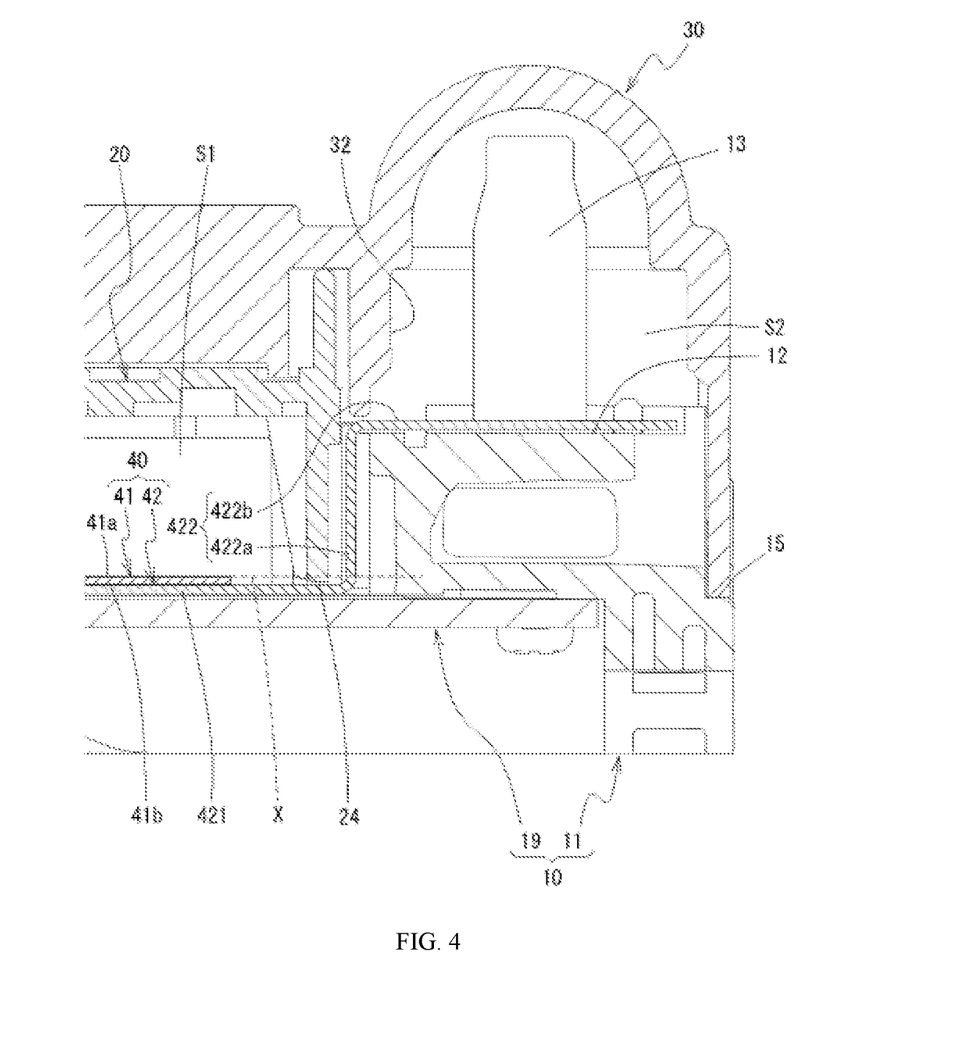
FIG. 4 is a cross-sectional view along a B-B line shown in FIG. 1 (the connection member is omitted).

The second casing member 20 is provided with the protruding portion 24 (see FIGS. 3 and 4, for example). The protruding portion 24 protrudes into the first space S1. Specifically, the protruding portion 24 protrudes downward from the upper wall of the second casing member 20. The second casing member 20 according to the present embodiment has at least the protruding portion 24 that is located inside outer wall portions 21 on both sides in the width direction, and that extends in the front-rear direction.

The protruding portion 24 intersects a plane X that extends along one surface 41a that is a mounting surface of the substrate 41 (a plane that is an extension of the one surface 41a). In other words, the end edge of the protruding portion 24 is located at a position that is lower than the one surface 41a of the substrate 41. Also, gaps that allow portions of the conductive member 42 to pass therethrough are present between the protruding portion 24 and the bottom surface of the first casing member 10 (the upper surface of the heat dissipation member 19). In other words, there are gaps that allow the above-described extension portions 422 to be drawn to the outside. The set 40 consisting of the substrate and the conductive member is configured to be placed on the bottom surface of the first casing member 10, with the substrate 41 on the upper side and the conductive member 42 on the lower side. Therefore, it is possible to draw the portions of the conductive member 42 to the outside despite the protruding portion 24 being formed so as to intersect the one surface 41a (the upper surface) of the substrate 41.

If such a protruding portion 24 is formed, it is possible to prevent water that has entered the first space S1 from flowing toward the substrate 41. In other words, the protruding portion 24 according to the present embodiment functions as a water stop wall that prevents (blocks) water from flowing toward the substrate 41. The protruding portion 24 is formed such that the end edge thereof is located at a position that is lower than the mounting surface of the substrate 41. Therefore, it is possible to prevent water from adhering to the mounting surface of the substrate 41 and from causing a problem such as a short circuit.

In this way, the set 40 consisting of the substrate and the conductive member (excluding portions of the extension portions 422) is housed in the first space S1, and portions (the top end portions 422b) of the extension portions 422 and a portion (the terminals 51) of the connection member 50 are housed in the second space S2. The casing 1a according to the present embodiment is provided with a structure for discharging water that has been, for example, condensed in the first space S1 in which the set 40 consisting of the substrate and the conductive member is housed, or water that has entered the first space S1 from the outside. The configuration of the water discharge structure is as follows. Note that, although the water discharge structure described below is provided on the right side of a front portion of the casing 1a in the width direction, such a water discharge structure may be provided on the left side of the front portion in the width direction, the right side of a rear portion in the width direction, or the left side of the rear portion in the width direction.

Figure 9:
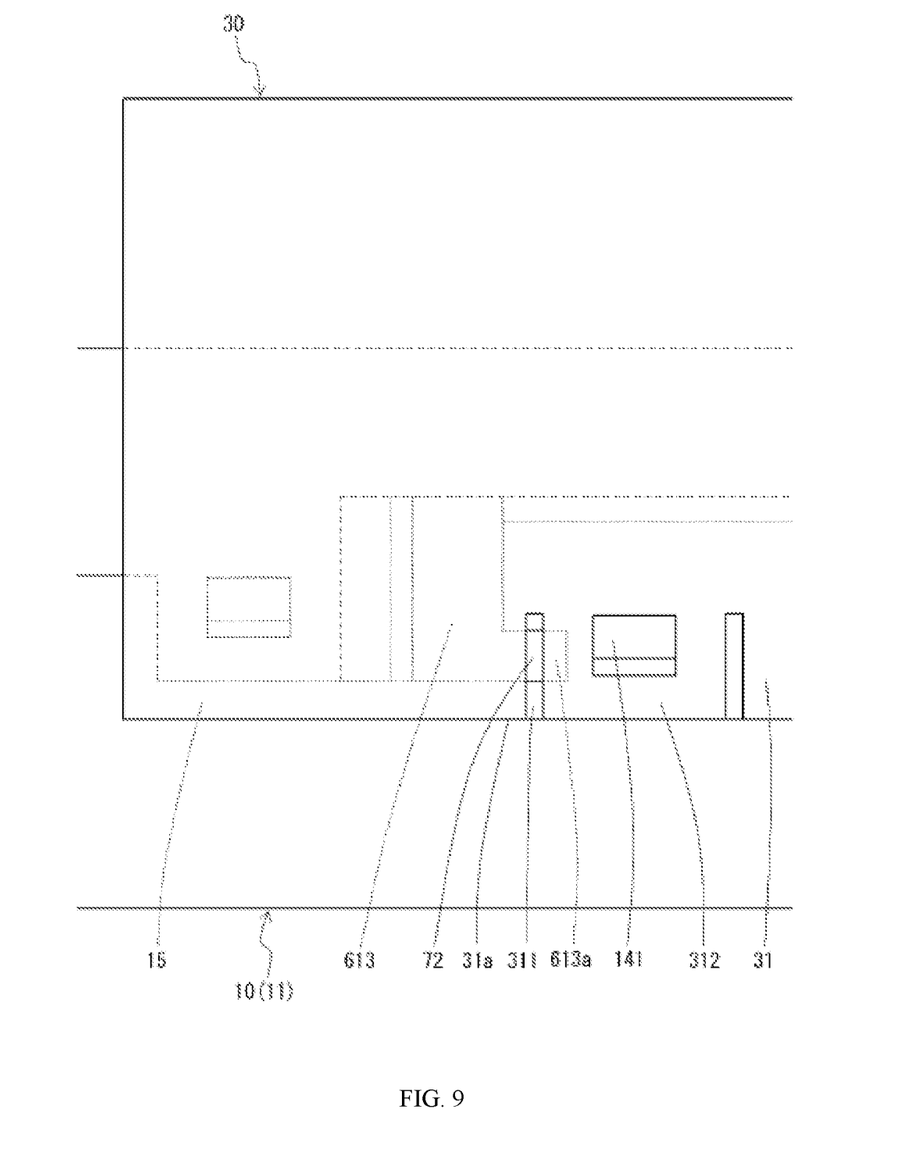
FIG. 9 is a side view of the substrate unit according to an embodiment of the present invention, viewed from a side where slits are formed.
Figure 10:
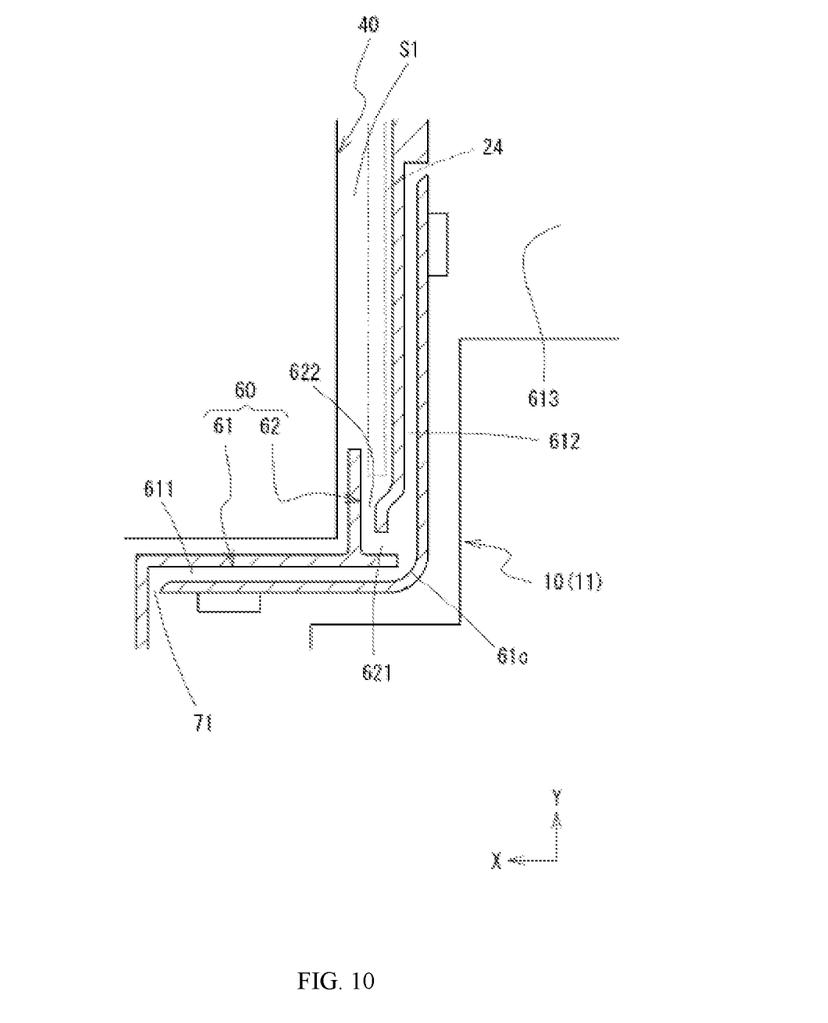
FIG. 10 is a diagram illustrating flow channels that are formed in a first casing member (a schematic view of a cross section of the first casing member along a plane that extends in an in-plane direction), and showing a positional relationship between a protruding portion and a flow channel (a second flow channel portion), where the protruding portion is represented as dotted lines.
Figure 11:
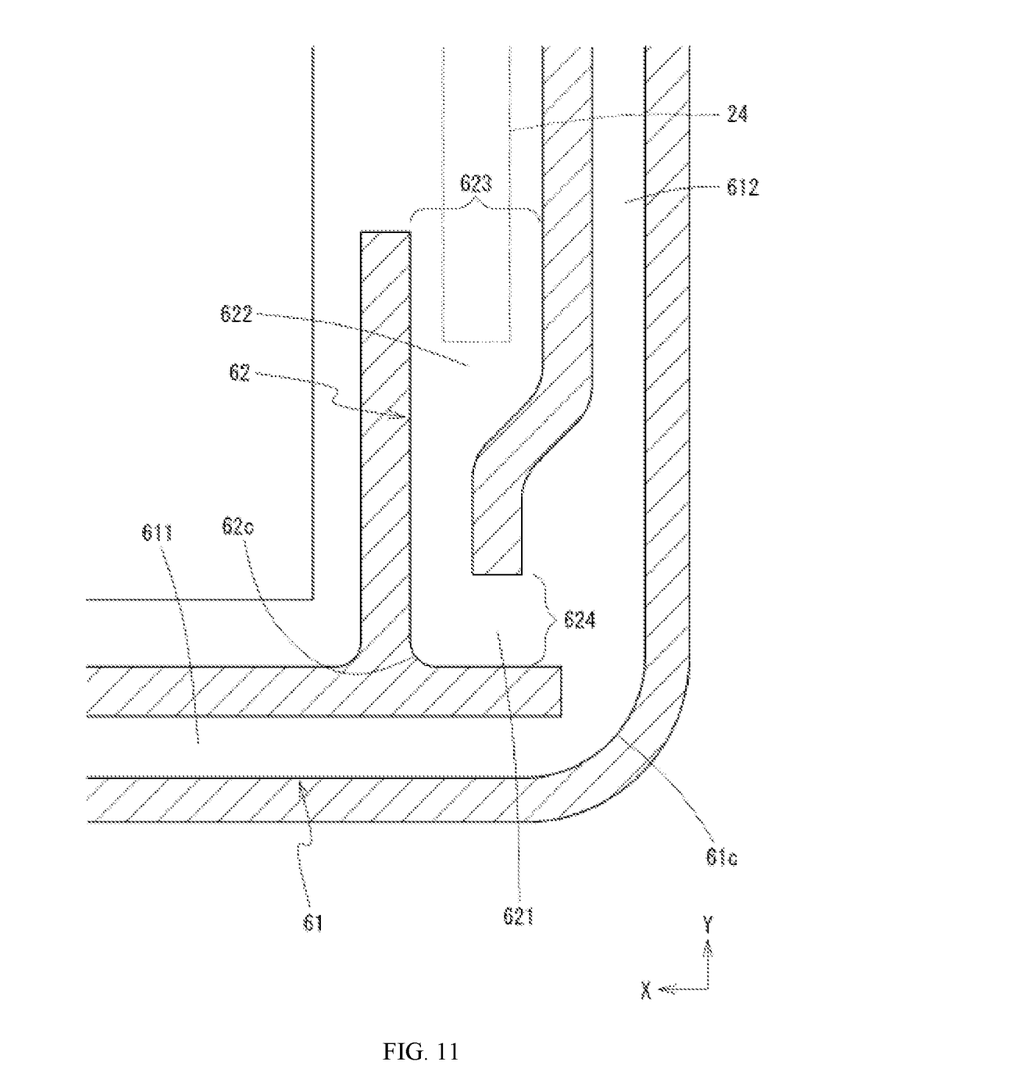
FIG. 11 is an enlarged view of a portion where a first flow channel portion and a second flow channel portion join to each other, and shows a positional relationship between the protruding portion and a flow channel (the second flow channel portion), where the protruding portion is represented as dotted lines.

The following describes the water discharge structure with reference to FIGS. 9 to 11, for example. A water discharge flow channel 60 that extends from the first space S1 is formed in the first casing member 10. The water discharge flow channel 60 includes a first flow channel portion 61 and a second flow channel portion 62. The first flow channel portion 61 is a flow channel whose two ends are connected to outlets (a first outlet 71 and a second outlet 72) (the two ends are open to the outside). The second flow channel portion 62 is a flow channel whose one end is connected to the first space S1 and the other end is connected to an intermediate portion of the first flow channel portion 61 (a portion between the first outlet 71 and the second outlet 72).

The first outlet 71 of the first flow channel portion 61 is provided in a middle portion of the casing 1a in the width direction. The height of the first outlet 71 is the same as the height of one end of the first flow channel portion 61. More specifically, the first outlet 71 is located at the same height as the boundary between the first casing member 10 and the third casing member 30 (see FIGS. 1 and 2, for example). The first flow channel portion 61 extends outward (rightward) in the width direction from the first outlet 71, and bends rearward at a midpoint. In other words, the first flow channel portion 61 includes a first portion 611 that extends in the width direction and a second portion 612 that extends in the front-rear direction (see FIG. 10, for example). A portion that is connected to the second flow channel portion 62 is located at or near the boundary between the first portion 611 and the second portion 612, in other words, a bent portion of the first flow channel portion 61. In other words, the boundary between the first flow channel portion 61 and the second flow channel portion 62 is located on the first portion 611 side in the second portion 612 of the first flow channel portion 61. It can be said that the first flow channel portion 61 includes a portion that is bent toward the second flow channel portion 62 (a first bent portion 61c) between the portion to which the second flow channel portion 62 is connected and the first outlet 71.

The second outlet 72 of the first flow channel portion 61 is provided in a middle portion of the casing 1a in the front-rear direction. The second portion 612 is connected to a space portion 613 that is formed in the first casing member 10 (the frame member 11). The space portion 613 is connected to the second outlet 72 (see FIGS. 9 to 11, for example). In other words, the first flow channel portion 61 according to the present embodiment is constituted by the first portion 611, the second portion 612 and the space portion 613. In other words, the water discharge flow channel 60 may include a portion that does not have a groove-like elongated shape as long as water can flow therethrough (the water discharge flow channel 60 may include an area having a large size like the space portion 613). The first portion 611 and the second portion 612 are grooves whose upper ends are open, and the second casing member 20 is provided so as to cover these openings. The space portion 613 is a portion that is covered by the third casing member 30.

As described above, the space portion 613 is connected to the second outlet 72. According to the present embodiment, a hole (a space) that serves as the second outlet 72 is formed in the third casing member 30. Specifically, a portion of a slit 311 that is formed in the third casing member 30 functions as the second outlet 72. The slit 311 is formed to allow a lock piece portion 312 to deform (to have a cantilever-like shape), and the slit 311 is used as the second outlet 72 for discharging water (see FIG. 9, for example).

A step is formed in at least some portions of an outer edge of the frame member 11 that constitutes the first casing member 10. Specifically, a step portion 15 that is depressed so as to be lower than the bottom surface of the first flow channel portion 61 (the first portion 611, the second portion 612, and the space portion 613) is formed. Also, a supporting protrusion 14 that protrudes upward is formed on the frame member 11 that constitutes the first casing member 10. The upper surface of the supporting protrusion 14 serves as the above-described base portion 12. A lock protrusion 141 that protrudes outward is formed on an outer surface of the supporting protrusion 14. The outer surface of the supporting protrusion 14 is the same as (is flush with) the surface of the step portion 15 that extends in the vertical direction. A groove (a lateral groove 613a) is formed in the frame member 11, where, in lateral view, the base end of a supporting protrusion 14 is partially hollowed out. The lateral groove 613a constitutes a portion of the space portion 613 (see FIGS. 2 and 9, for example).

The third casing member 30 is pressed against the frame member 11 from the outer surface of the above-described supporting protrusion 14 such that the inner surface of an outer wall portion 31 of the third casing member 30 faces the surface of the step portion 15 that extends in the vertical direction, and consequently the lock piece portion 312 that is formed in the outer wall portion 31 is elastically deformed by being brought into contact with the lock protrusion 141. The third casing member 30 is further pressed against the frame member 11, and consequently, the lock piece portion 312 returns to its original shape, and the lock protrusion 141 fits into a through hole that is formed in the lock piece portion 312.

Consequently, the third casing member 30 is fixed to the first casing member 10 (the frame member 11). In a situation where the third casing member 30 is fixed to the first casing member 10, an end portion of the outer wall portion 31 of the third casing member 30 fits to the step portion 15. In other words, the inner surface of the end portion of the outer wall portion 31 of the third casing member 30 is in intimate contact with the surface of the step portion 15 that extends in the vertical direction, and at least a portion of an end (an end edge 31a) of the outer wall portion 31 of the third casing member 30 is located at a position where the space portion 613 (the lateral groove 613a) of the first flow channel portion 61 that is provided in the frame member 11 is connected to the slit 311, i.e., a position that is lower than the second outlet 72.

More specifically, an end edge 31a of the portion of an outer wall portion 31 of the third casing member 30 where the slit 311 (the lock piece portion 312) is formed is located at a position that is lower than the second outlet 72. From yet another point of view, it can be said that the boundary between the first casing member 10 and the third casing member 30 in an outer surface of the casing 1a in the width direction (the boundary line that extends in the front-rear direction) is located at a position that is lower than the second outlet 72. The slit 311 is formed so as to extend in the vertical direction from the end of an outer wall portion 31 of the third casing member 30, and therefore an upper portion of the slit 311 is configured to overlap the space portion 613 (the lateral groove 613a) of the first flow channel portion 61 (see FIG. 9, for example).

The first outlet 71 of the first flow channel portion 61 is formed at the same height as the boundary between the first casing member 10 and the second casing member 20 (see FIGS. 1 and 2, for example). On the other hand, the second outlet 72 of the first flow channel portion 61 is located at a position that is higher than the boundary between the first casing member 10 and the third casing member 30 (see FIG. 9, for example). More specifically, there is the risk of water that enters from the boundary between the first casing member 10 and the second casing member 20 (a gap between these two casing members) directly entering the inside from the first outlet 71, whereas water that enters from the boundary between the first casing member 10 and the third casing member 30 (a gap between these two casing members) is blocked by the step portion 15. In other words, the risk of water entering via the second outlet 72 is much lower than the risk of water entering via the first outlet 71.

The second flow channel portion 62 is a flow channel that connects the first space S1 and the first flow channel portion 61 to each other. The second flow channel portion 62 is bent. Specifically, the second flow channel portion 62 includes a first portion 621 through which water that has entered from the first flow channel portion 61 flows straight, and a second portion 622 that is bent from the first portion 621 and extends toward the first space S1. The boundary between the first portion 621 and the second portion 622 is bent (a second bent portion 62c) (see FIGS. 10 and 11, for example). According to the present embodiment, the first portion 621 extends in the width direction, and the second portion 622 in the front-rear direction. In this way, a structure in which water that has entered the second flow channel portion 62 from the first flow channel portion 61 is prevented from flowing straight and directly reaching the first space S1 is employed, and thus water is prevented from entering the first space S1 via the second flow channel portion 62.

In addition, the second flow channel portion 62 is required to achieve the function of preventing water from entering the first space S1 while achieving the function of smoothly discharging water from the first space S1. Therefore, the size of a flow channel-side opening 624, which faces the first flow channel portion 61, of the second flow channel portion 62 is set to be smaller than the size of a space-side opening 623, which faces the first space S1, of the second flow channel portion 62 (see FIG. 11, for example). Consequently, it is possible to achieve a structure where water in the first space S1 is likely to enter the second flow channel portion 62, and water in the first flow channel portion 61 is unlikely to enter the second flow channel portion 62.

In addition, according to the present embodiment, portions of the protruding portion 24 on both sides in the width direction is inserted into the second flow channel portion 62 (see FIGS. 10 and 11, for example). Specifically, portions of the protruding portion 24 on both sides in the width direction is inserted into the second flow channel portion via the opening of the second flow channel portion on the space side. Water that has entered the first space S1 is restricted from moving toward the substrate 41 by the protruding portion 24. Therefore, the water flows through the gaps between the protruding portion 24 and the inner wall surface of the first casing member 10 (the frame member 11). In other words, the water flows through the flow channel that is formed between the protruding portion 24 and the inner surface of the first casing member 10 (the frame member 11). The channel leads to the second flow channel portion 62 that constitutes the water discharge flow channel 60, and therefore the water is directly discharged to the outside. That is to say, the protruding portion 24 according to the present embodiment functions not only as a water stop wall for preventing water from flowing toward the substrate 41, but also as a member that guides water to the water discharge flow channel 60 in conjunction with the first casing member 10.

Although embodiments of the present invention has been described above in detail, the present invention is not limited to the above-described embodiments in any manner, and may be variously modified within the spirit of the present invention.

For example, although the substrate unit 1 according to the above-described embodiments has been described as being a substrate unit that is provided with the first casing member 10, the second casing member 20, and the third casing member 30, the number of casing members that are included in the casing 1a, the specific configuration of each casing member, and so on may be modified as appropriate.

Also, although the substrate unit 1 according to the above-described embodiments has been described as being a substrate unit in which the set 40 consisting of the substrate and the conductive member is housed in the casing 1a, the contents of the first space S1 may be only the substrate 41. Also, any contents may be housed in the second space S2. It is also possible to employ a configuration without the second space S2.

Although the protruding portion 24 is provided outside the substrate 41 in the width direction in the above-described embodiments, the position where the protruding portion 24 is provided and the size (the length) of the protruding portion 24 may be modified as appropriate as long as the protruding portion 24 is provided outside the substrate 41. For example, the protruding portion 24 may be provided so as to surround the substrate 41.

The invention claimed is:

1. A substrate unit comprising:
   a substrate;
   a first casing member having a bottom surface presenting a planar support surface that supports the substrate; and
   a second casing member that is integrated into one piece with the first casing member and is provided on a mounting surface side of the substrate;
   wherein the second casing member is provided with a protruding portion defined by an inner wall spaced apart from an outer wall of the second casing so as to be disposed within a housing space that is defined by the first casing member and the second casing member and houses the substrate, the protruding portion extending to a distal end and intersects a plane that extends along the mounting surface of the substrate, wherein the distal end of the protruding portion is spaced apart from a heat dissipation member so as to accommodate a height of a conductive member, and wherein a portion of the distal end is spaced apart from the conductive member so as to define a gap, and
   wherein the first casing member includes a first inner wall spaced apart from a second inner wall so as to define a water discharge flow channel, a portion of both the first and second inner walls extend above the mounting surface of the substrate;

a portion of the protruding portion further extends in a direction along the plane of the mounting surface of the substrate and is also between the first inner wall and the second inner wall and above the mounting surface of the substrate so as to be inserted into the water discharge flow channel that is formed in the first casing member, wherein the water discharge flow is open to an exterior of the first casing member.

2. The substrate unit as set forth in claim 1, wherein the bottom surface of the first casing member is the heat dissipation member.

* * * * *